United States Patent [19]

DeGroot

[11] Patent Number: 5,127,731
[45] Date of Patent: Jul. 7, 1992

[54] STABILIZED TWO-COLOR LASER DIODE INTERFEROMETER

[75] Inventor: Peter DeGroot, Bellevue, Wash.

[73] Assignee: Hughes Aircraft Company, Los Angeles, Calif.

[21] Appl. No.: 652,753

[22] Filed: Feb. 8, 1991

[51] Int. Cl.$^5$ .............................................. G01B 9/02
[52] U.S. Cl. .................................. 356/349; 356/359; 372/32; 372/29
[58] Field of Search ....................... 356/360, 349, 352; 372/32, 28, 29; 356/345

[56] References Cited

U.S. PATENT DOCUMENTS

| | | | |
|---|---|---|---|
| 4,821,273 | 2/1989 | Hori | 372/32 |
| 4,832,489 | 5/1989 | Wyant et al. | 356/359 |
| 4,930,133 | 5/1990 | Babbitt et al. | 372/32 |

OTHER PUBLICATIONS

"Two-Wavelength Scanning Spot interferometer Using Single-Frequency Diode Lasers" by A. J. den Boef Applied Optics, vol. 27, No. 2, 15 Jan. 1988.
"Absolute Optical Ranging With 200-nm Resolution" by C. Williams et al. 1989 Optics Letters vol. 14, No. 11 Jun. 1989.
"Contouring Aspheric Surfaces Using Two-Wavelength Phase-Shifting Interferometry" by K. Creath et al. Optical Acta, 1985, vol. 32, No. 12, 1455–1464.
"Two-Wavelength Speckle Interferometry on Rough Surfaces Using a Mode Hopping Diode Laser" by A. Fercher, Optics and Lasers in Engineering II (1989) 271–279.

Primary Examiner—Samuel A. Turner
Assistant Examiner—Richard E. Kurtz, II
Attorney, Agent, or Firm—W. K. Denson-Low; W. J. Streeter; R. A. Hays

[57] ABSTRACT

The phase ambiguity of conventional interferometers may be removed by using two laser diodes of different optical frequency to generate a synthetic wavelength. However, the stability requirements for a two-color interferometric laser gauge that must provide unambiguous determination of the optical fringe order over a large distance can be severe. The invention determines upper limits on the optical wavelength uncertainty and expresses same as a function of optical path difference between object and reference beams, phase measurement errors and the synthetic wavelength. A wavelength stabilization arrangement involves simultaneous servo control of two laser diodes (10, 12) with a single Fabry-Perot etalon (36). An embodiment of the invention demonstrates its effectiveness for long-term stabilized two-color interferometry over a distance of 250 mm, with a 15 μm synthetic wavelength and a repeatability of 40 nm. For periods of less than 1000 seconds, the repeatability is eight nm.

9 Claims, 3 Drawing Sheets

STABILIZED TWO-COLOR LASER DIODE INTERFEROMETER

FIELD OF THE INVENTION

This invention relates generally to interferometers and, in particular, to a wavelength stabilized two source interferometer.

BACKGROUND OF THE INVENTION

Interferometric measurements using phase-modulation or optical heterodyne techniques are presently capable of measurement resolutions of one nanometer. Because of phase ambiguities, these are typically relative measurements of displacement from an initial position with a limit on the allowable displacement between measurements of $\pm \lambda/4$, where $\lambda$ is the source wavelength. For near-infrared sources, such as GaAlAs laser diodes, $\lambda/4$ is on the order of 200 nm. However, this ambiguity interval is sufficiently small that air turbulence vibration or momentary interruptions of the beam may adversely affect phase tracking techniques for displacement measurement. Furthermore, if the measurement bandwidth is low, phase tracking may not be possible and the dynamic range is reduced to the $\pm \lambda/4$ ambiguity interval.

In order to maintain interferometric accuracy while eliminating phase ambiguities over a larger range of displacements, two wavelengths can be employed to generate a synthetic wavelength $\Lambda$ that is longer than either of the optical wavelengths $\lambda_1$ or $\lambda_2$. With such a two color source, interferometric metrology can be performed within the significantly longer, range of $\pm \Lambda/4$, without ambiguity and without sacrificing the accuracy of the single-source instrument.

The following journal articles all discuss aspects of employing two source wavelengths for interferometric metrology: K. Creath, "Step Height Measurement Using Two-Wavelength Phase-Shifting Interferometry", Appl. Opt. 26(14), 2810 (1987). J. C. Wyant, "Testing Aspherics Using Two-wavelength Holography", Appl. Opt. 10(14) 2113-2118 (1971); C. Polhemus, "Two-wavelength Interferometry", Appl. Opt. 12(14) 2071-2074 (1973); Y. Cheng and J. C. Wyant, "Two-wavelength Phase Shifting Interferometry", Appl. Opt. 23(29), 4539-4543 (1984); and K. Creath, Y. Cheng and J. C. Wyant, "Contouring Aspheric Surfaces Using Two-wavelength Phase-shifting interferometry", Opt. Act. 32 (17), 1455-1464.

Although the usefulness of synthetic wavelengths for removing phase ambiguities has been well documented, the practical application of these techniques depends on the availability of compact, efficient and reliable multiple-wavelength sources. One approach is to use two single-wavelength, GaAlAs laser diodes, which are commercially available with a variety of far-red and near-infrared wavelengths.

The following journal articles discuss the application of two laser diodes: C. C. Williams and H. K. Wickramasinghe, "Absolute Optical Ranging With 200 nm Resolution:, Opt. Let. 14(11), 542-544 (1989); C. C. Williams and H. K. Wickramasinghe, "Optical Ranging by Wavelength Multiplexed Interferometry" J. Appl Phys. 60(6), 1900-1903 (1986); A. J. den Boef, "Two-wavelength Scanning Spot Interometer using Single-frequency Diode Lasers", Appl. Opt. 27 (2) 306-311 (1988); and A. F. Fercher, U. Vry and W. Werner, "Two-wavelength Speckle Interferometry on Rough Surfaces Using a Mode Hopping Diode Laser", Optics and Lasers in Engineering 11, 271-279 (1989).

One significant advantage of laser diodes for two-color interferometry is the wavelength-tunability of these devices with temperature. However, this advantage also presents a problem of long-term wavelength drift due to thermal effects. This drift renders the synthetic wavelength data useless for the purpose of resolving phase ambiguities. The latter group of journal articles referenced above apply principally to imaging applications involving rapid scanning and small optical path differences, and the importance of wavelength stabilization is not addressed. For applications demanding long-term repeatability with optical path differences of greater than a millimeter, the requirements for wavelength control as well as methods for achieving the required control must be considered.

Before describing in detail the presently preferred embodiment of the invention a discussion is first made of the wavelength stability requirements of a conventional one-color, or wavelength, interferometer and a two-color interferometer.

The terms optical separation, fringe number, fringe order and uncertainty are introduced and defined for use in the subsequent consideration of the two color system of the invention.

One-Color Interferometer

An interferometer using a single wavelength $\lambda$ obtains a measured value $L_\lambda$ of the optical separation L between a reference and an object mirror by a determination of the fringe number m:

$$L_\lambda = \frac{m\lambda}{2} \quad (1)$$

The optical separation is considered to be a one-way difference in optical path length, including the refractive index, for the reference and object beams in the interferometer. Generally, the integer part, or "fringe order", of the fringe number m is unknown and cannot be determined by a single-wavelength phase measurement alone. Apart from this ambiguity, errors in the determination of the fractional part of the fringe number and wavelength instabilities result in an error in the length measurement given by $$\delta L_\lambda = \frac{\lambda}{2} \delta m + \frac{m}{2} \delta \lambda. \quad (2)$$

The "uncertainty" $\Delta L_\lambda$ in the measured length $L_\lambda$ is defined to be the maximum absolute value of the error $\delta L_\lambda$:

$$\Delta L_\lambda = \frac{\lambda}{2} \Delta m = \frac{m}{2} \Delta \lambda, \quad (3)$$

where $$\Delta \lambda = |\delta \lambda|_{MAX} \quad (4)$$

and $$\Delta m = |\delta m|_{MAX} \quad (5)$$

In the design of an interferometer there is specified an accuracy of $\alpha$ units of $\lambda$ (e.g. "tenth-wave" accuracy)

corresponding to the largest allowable $\Delta L_\lambda$. This establishes a wavelength stability requirement given by:

$$\frac{\Delta\lambda}{\lambda} < \frac{\lambda}{L}\left(\alpha - \frac{\Delta m}{2}\right). \tag{6}$$

However, once the requirement of Eq. (6) is met the ambiguity in the integer part of m remains to be considered. Multiple wavelengths become useful for this purpose.

Two Color Interferometer

Two wavelengths $\lambda_1$ and $\lambda_2$ give two independent fringe numbers m1 and m2 for the same optical path. A synthetic fringe number M is defined by $$M = m_1 - m_2 \tag{7}$$

and a corresponding synthetic wavelength $\Lambda$ by $$\frac{1}{\Lambda} = \frac{1}{\lambda_1} - \frac{1}{\lambda_2}. \tag{8}$$

A measurement $L_{79}$ of the distance L based on the synthetic wavelength $\Lambda$ is then given by $$L_\Lambda = M\frac{\Lambda}{2}. \tag{9}$$

The advantage presented by this approach is that the synthetic fringe number M varies more slowly with L than either one of the optical fringe numbers $m_1, m_2$. Thus, changes in the integer part of m due to variation in optical separation L that are less than $\Lambda/2$ may be determined by referring to the measured fractional part of the synthetic fringe number M. This can be useful for a number of applications, such as a laser garage operated intermittently, an optical metrology system using a coarse-grid detector array, a discontinuous surface, or a rough surface.

The synthetic wavelength determination of changes in the optical fringe order are meaningful only if errors $\delta L_\Lambda$ in the synthetic wavelength measurement and $\delta L_\lambda$ in the optical wavelength measurement are within $\pm\lambda/4$ of each other. This condition can be expressed as $$|\delta L_\Lambda - \delta L_{80}| < \lambda/4 \tag{10}$$

This imposes additional requirements on the optical wavelength stabilities beyond those deriving from the desired accuracy of the interferometer as expressed in Eq. (6). It is useful to first determine $\delta L_\Lambda$ and $\delta L_\lambda$ starting with the synthetic wavelength measurement, $$\delta L_\Lambda = \frac{\Lambda}{2}\delta M + \frac{M}{2}\delta\Lambda. \tag{11}$$

Using Eq. (7) for M, Eq (8) for $\Lambda$ and Eq. (9) for $L_\Lambda$ there is obtained $$\delta L_\lambda = \left(\frac{\lambda_1}{4}\delta m_1 - \frac{\lambda_1}{4}\delta m_2\right) + \frac{L}{2}\left(\frac{\delta\lambda_1}{\lambda_1} - \frac{\delta\lambda_2}{\lambda_2}\right). \tag{12}$$

The optical measurement may be taken as the average of the measurements for $\lambda_1$ and $\lambda_2$:

$$L_\lambda = \frac{1}{2}\left(\frac{\lambda_1 m_1}{2} + \frac{\lambda_2 m_2}{2}\right). \tag{13}$$

The error in this measurement is expressed as:

$$\delta L_\lambda = \left(\frac{\lambda_1}{4}\delta m_1 + \frac{\lambda_1}{4}\delta m_2\right) + \frac{L}{2}\left(\frac{\delta\lambda_1}{\lambda_1} + \frac{\delta\lambda_2}{\lambda_2}\right). \tag{14}$$

Combining these results into Eq. (10) there is obtained:

$$\left|\delta m_1\left(\frac{\Lambda}{2} - \frac{\lambda_1}{4}\right) - \delta m_2\left(\frac{\Lambda}{2} + \frac{\lambda_2}{4}\right) + \right.$$
$$\left.\frac{\delta\lambda_1}{\lambda_1}L\left(\frac{\Lambda}{\lambda_1} - \frac{1}{2}\right) - \frac{\delta\lambda_2}{\lambda_2}L\left(\frac{\Lambda}{\lambda_2} + \frac{1}{2}\right)\right|\text{MAX} < \frac{\lambda}{4} \tag{15}$$

The constant coefficients in parentheses are all positive and are thus equal to their absolute values. If it is assumed that the errors are entirely independent and uncorrelated then it is reasonable to make the identifications:

$$\begin{aligned}|\delta m_1| \text{ MAX} &= \Delta m \\ |-\delta m_2| \text{ MAX} &= \Delta m \\ |\delta\lambda_1| \text{ MAX} &= \Delta\lambda \\ |-\delta\lambda_2| \text{ MAX} &= \Delta\lambda.\end{aligned} \tag{16}$$

In addition, $\lambda = \lambda_1 \approx \lambda_2$. In subsequent algebra, the factors $\lambda_1/4$ and $\lambda_2/4$ in the first two terms cancel, as do the factors of $\frac{1}{2}$ in the second two terms. As a result, Eq. (15) becomes $$\Delta m\Lambda + \frac{\Delta\lambda}{\lambda}\frac{2\Lambda L}{\lambda} < \frac{\lambda}{4}, \tag{17}$$

which can be employed to determine the required relative stability in wavelength as:

$$\frac{\Delta\lambda}{\lambda} < \frac{\lambda}{L}\left(\frac{\lambda}{8\Lambda} - \frac{\Delta m}{2}\right). \tag{18}$$

Figure 1:
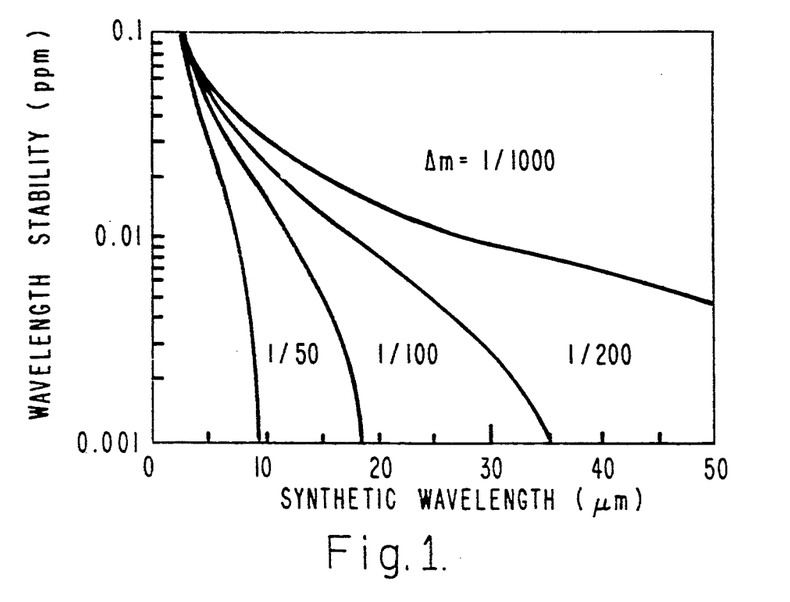
FIG. 1 a graph illustrating, for a two-color interferometer, the upper limits of wavelength instability as a function of synthetic wavelength.

Equation (18) was employed to generate the curves shown in FIG. 1. The curves of FIG. 1 show upper limits of wavelength instability for a two-color interferometer as a function of synthetic wavelength for an optical path difference (one way) of L = 250 mm between reference and object mirrors. Shown are four different curves for uncertainties of 2%, 1%, 0.5% and 0.1% in the optical phase measurement. Wavelength stability is determined by the requirement that the error in the synthetic wavelength measurement be small enough to permit unambiguous determination of the integer part of the optical fringe order. By making the identification of the factor $\lambda/8\Lambda$ in Eq. (18) with the parameter $\alpha$ in Eq. (6) it can readily be seen that the wavelength stability requirements for unambiguous identification of the optical fringe order are severe. A synthetic wavelength of $\Lambda = 20v$ requires stabilization equivalent to that of a single-wavelength interferometer with an uncertainty of $\lambda/160$. Further, it is noted that the requirement of zero error in the resolution of the optical fringe order for two-color interferometry requires that the maximum absolute value of the measurement error for the definition of uncertainty be used, rather than a standard deviation. Since the principal source of wavelength variation in a laser diode is the temperature dependence of the optical length of the diode cavity, Eq. (18) may be rewritten by letting $$\frac{\delta \lambda_1}{\lambda_1} = \frac{\delta l_1}{l_1}, \qquad (19)$$

where $\delta l_1/l_1$ is the relative change in cavity length due to temperature and pressure fluctuations. A similar equation can be written for $\lambda_2$. Eq. (18) thus becomes $$\frac{\Delta l}{l} < \frac{\lambda}{L}\left(\frac{\lambda}{8\Lambda} - \frac{\Delta m}{2}\right), \qquad (20)$$

where $\Delta l/l$ is the maximum absolute value of $\delta l/l_1$ and $\delta l_2/l_2$. In that a primary concern is the occurrence of thermal fluctuations in 1, Eq. (20) may be rewritten for the maximum allowable uncertainty $\Delta T$ in temperature:

$$\Delta T < \frac{1}{X} \frac{\lambda}{L}\left(\frac{\lambda}{8\Lambda} - \frac{\Delta m}{2}\right), \qquad (21)$$

where $\chi$ is the coefficient of thermal expansion of optical length. The coefficient of thermal expansion for a typical laser diode is approximately 80 ppm/C. Taking again the example of a synthetic wavelength of $\Lambda = 20\lambda$, $\Delta m = 1/200$ and L = 250 mm $\Delta T$ is found to equal 150µC. Such a small thermal tolerance is impractical to achieve based on control of the temperature of the laser diode mount. This is particularly true if the laser diodes are contained in standard packages and are used with commercially available thermoelectric coolers. It is again noted that if the stabilization criterion is not met the synthetic wavelength will be of no use whatsoever in resolving the optical fringe order.

A known technique for stabilizing a laser diode is to use an external frequency standard or optical spectrum analyzer that senses variations in diode temperature through a measurement of the laser diode emission wavelength. Fine control of the laser diode temperature is achieved by electronic feedback to the diode pump current, thereby altering the equilibrium temperature of the diode with respect to its mount. A Fabry-Perot etalon is frequently used for this purpose. However, if both laser diodes in a two-color source were to be controlled by two independent Fabry-Perot etalons, then optical path length variations due to mechanical or thermal distortions in the individual etalon cavities are uncorrelated and Eq. (20) still applies, although with a smaller value of $\chi$.

It is thus one object of the invention to overcome the deficiencies of a two Fabry-Perot etalon wavelength compensation technique by providing a single external etalon for controlling the wavelength stability of two laser diodes in a two-color interferometer.

SUMMARY OF THE INVENTION

In accordance with the invention there is provided apparatus and method for controlling and overcoming thermally-induced wavelength drift in a two laser diode interferometric apparatus. Upper limits on the wavelength uncertainty for independent laser diodes in a two-color interferometer are derived and are expressed as a function of the optical path difference between object and reference beams, noise-dependent phase demodulation errors and synthetic wavelength. As considered herein it is assumed that the sole function of the synthetic phase is to resolve the phase ambiguities in the optical wavelength data over a displacement range equal to one half of the synthetic wavelength. In order to be of use a synthetic wavelength of 15 µm requires wavelength stabilities on the order of 0.01 ppm for a 250 mm one-way optical path difference.

In accordance with a detailed analysis presented below, a wavelength stabilization technique of the invention is disclosed that involves simultaneous control of two laser diodes by electronic feedback from a single, common Fabry-Perot spectrometer. This technique has the advantage that variations in the length of the common Fabry-Perot cavity does not contribute to a relative error between optical and synthetic-wavelength measurements. The system of the invention is more compact and reliable than those systems of the prior art using independent stabilization, and furthermore permits the extension of current two-color laser-diodes techniques to applications requiring long-term stability over large optical path distances.

The use of the invention beneficially removes the phase ambiguity in conventional interferometers by employing two laser diodes of different optical frequency to generate a synthetic wavelength. Upper limits of the optical wavelength uncertainty are derived and are expressed as a function of optical path difference between object and reference beams, phase measurement errors and the synthetic wavelength. The invention provides a relatively simple wavelength stabilization arrangement that involves simultaneous servo control of both laser diodes with a single Fabry-Perot etalon. The wavelength stabilization system of the invention is shown to be effective for long term stabilized two-color interferometry over a distance of 250 mm with a 15 micron synthetic wavelength and a repeatability of 40 nm. For periods of less than 1000 seconds, the repeatability is shown to be eight nanometers.

BRIEF DESCRIPTION OF THE DRAWINGS

The foregoing and other aspects of the invention are made more apparent in the ensuing detailed description of the invention when read in conjunction with the attached drawing, wherein.

DETAILED DESCRIPTION OF THE INVENTION

Figure 2:
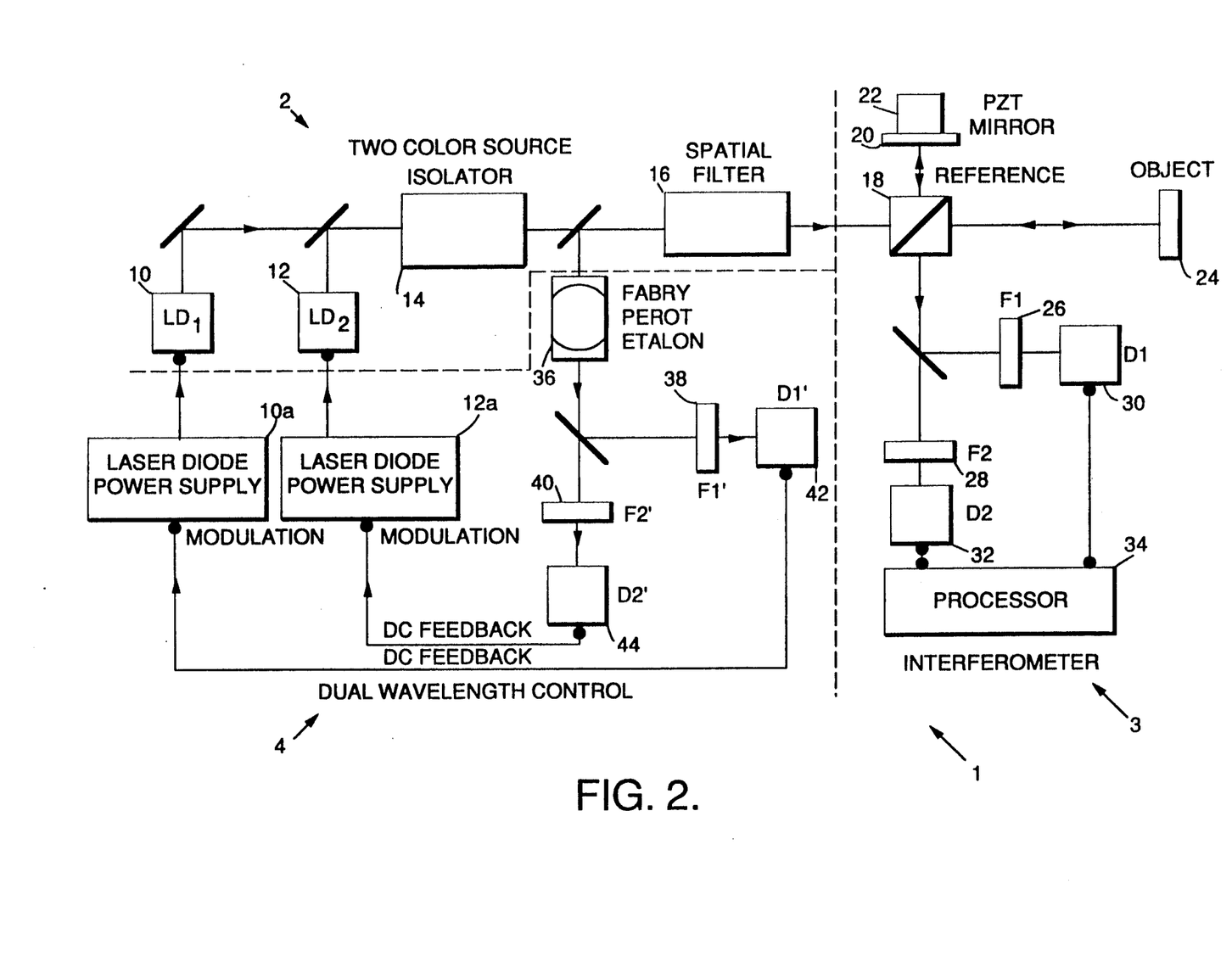
FIG. 2 is a simplified block diagram showing an interferometer, constructed in accordance with the invention, having a common etalon for simultaneously stabilizing a pair of laser diodes.

Referring to FIG. 2 there is shown an embodiment of the invention wherein a single external etalon is employed to control the wavelength stabilization of two laser diodes. Not shown in FIG. 2 is the conventional arrangement of two quarter wave plates and analyzer to improve a light efficiency of the interferometer. An interferometer system 1 includes a two color source 2, an interferometer 3 and, in accordance with the invention, a dual wavelength control 4. Source 2 is comprised of a first laser diode (LD1) 10 and a second laser diode (LD2) 12, each being coupled to an associated power supply 10a and 12a. LD1 and LD2 may be two commercially available laser diodes known in the art as Sharp LT027MDO and LT015MDO devices having wavelengths of 785 nm and 828 nm, respectively, for a resulting synthetic wavelength of approximately 15 $\mu$m. These wavelengths are sufficiently well separated to permit the use of common-path optics and interference filters for separation of the wavelengths for the phase measurements and for wavelength stabilization. An isolator 14 is provided to prevent optical feedback from entering the laser diodes. The outputs of LD1 and LD2 are provided to a spatial filter 16 which creates a spatially coherent colinear beam for each diode output and prevents any misalignment between the beams from LD1 and LD2 from contributing to uncorrelated errors. The output of the spatial filter 16 forms the output of the two color source 2. Considering now the interferometer 3 there is provided a beamsplitter 18 which provides a reference beam to a reference mirror 20 that is coupled to a PZT actuator 22. The dithering of the PZT actuator 22 phase modulates the colinear reference beams. An output beam is provided to an object mirror 24 for measuring the displacement of the object. For the illustrated embodiment the interferometer system 1 operates over a range of zero to 250 mm with a resolution of two nanometers. The reflected reference and object beams are provided to interference filters F1 26 and F2 28 and to corresponding photodiode detectors D1 30 and D2 32, respectively. A processor 34 is coupled to the outputs of the detectors 30 and 32 for measuring the phase $\Theta$ in accordance with, by example, a modification of the five-points algorithm described by Schwider et al. "Digital Wave-front Measuring Interferometry: Some Systematic Error Sources", Appl. Opt. 22, 3421 (1983) and by Hariharan et al. "Digital Phase-shifting Interferometry: A Simple Error-compensating Phase Calculation Algorithm", Appl. Opt. 26 (13) 2504–2506 (1987). The reference mirror 20 is moved axially to five discrete positions, and the outputs photodiode detectors 30 and 32 are sampled at both wavelengths for each of the five positions. Measurement errors attributable to the difference in the two wavelengths $\lambda 1$ and $\lambda 2$ are avoided by calculating the exact value of the phase separation $\beta$ between the points rather than assuming $\beta = \pi/2$, and providing a correction term to the algorithm for each of the wavelengths. An additional modification to this procedure involves an explicit extension of the phase measurement $\Theta$ over the full $2\pi$ range.

In accordance with the invention common cavity stabilization of LD1 10 and LD2 12 is achieved with a single Fabry Perot etalon 36 that is disposed for receiving a portion of the outputs from both LD1 10 and LD2 12. For the example illustrated etalon 36 is a 2.5 cm confocal air-spaced structure. An output of the etalon 36 is provided to interference filters F1′ 38 and F2′ 40. Outputs of the two filters 38 and 40 are provided to respective photodiode detectors D1′ 42 and D2′ 44. DC outputs of the detectors 42 and 44 are fed back to the power supplies 10a and 12a of LD1 10 and LD2 12, respectively, for providing pump current fine control of diode temperature in accordance with the measurement, via the etalon 36 and filters 38 and 40, of the diode emission wavelengths.

The common etalon cavity stabilization technique of the invention results in a reduction in hardware as well as a significant relaxation of the thermal and mechanical stability tolerances. In effect, any change in the optical length of the etalon 36 produces correlated errors that effect the synthetic wavelength measurement $L_\Lambda$ in exactly the same manner as the optical wavelength measurement $L_\lambda$. Thus, the following identifications may be made:

$$\frac{\delta\lambda_1}{\lambda_1} = \frac{\delta l}{l} + \left(\frac{\delta\lambda_1}{\lambda_1}\right) UNC, \tag{22}$$

and $$\frac{\delta\lambda_2}{\lambda_2} = \frac{\delta l}{l} + \left(\frac{\delta\lambda_2}{\lambda_2}\right) UNC, \tag{23}$$

where $\{\}UNC$ refers to uncorrelated locking errors and system noise. Inserting these relations into Eq. (15), and noting that $\Lambda/\lambda_2 - \Lambda/\lambda_1 = 1$, it can be seen that the relative wavelength errors due to $\delta l/l$ cancel. As a result, the only requirement for unambiguous identification of the optical fringer order is $$\left(\frac{\Delta\lambda}{\lambda}\right) UNC < \frac{\lambda}{L}\left(\frac{\lambda}{8\Lambda} - \frac{\Delta m}{2}\right). \tag{24}$$

Thus, the stability requirement is reduced to a limitation upon locking errors, independently of any mechanical or thermal variations in the cavity length or the common-path geometry of the locking system. The uncertainty $\Delta l/l$ is important only in determining the final accuracy of the measurement, according to $$\alpha = \frac{L}{\lambda}\left(\frac{\Delta l}{l} + \left(\frac{\Delta\lambda}{\lambda}\right) UNC\right) + \frac{\Delta m}{2}. \tag{25}$$

The foregoing analysis shows that the common external reference cavity 36 is used to advantage for stabilizing both frequencies in a two-frequency laser diode interferometer. Furthermore, the stability requirements on the optical length of the cavity are no more severe than they would be for a single-frequency interferometer. This is a significant result in light of the severe stability requirements for a two-color system expressed previously in Eq. (18).

Considering the intensities measured by the five-points algorithm mentioned previously, and referring to the intensities measured by one of the photodetectors at the five phase point as $I_1 \ldots I_5$, the phase calculation algorithm for the system of the invention is $$\Theta = \tan^{-1}\left(\frac{X}{Y}\sin\beta\right) + \frac{\pi}{2}\left(1 - \frac{Y}{|Y|}\right), \quad (26)$$

where $$X = 2(I_4 - I_2) \quad (27)$$

and where $$Y = 2I_3 - I_5 - I_1 \quad (28)$$

Measurements at zero optical separation between the reference mirror 20 and object mirror 24 shows a measurement uncertainty $\Delta m$ for the fringe order m of 0.5%. This measurement uncertainty is due to systematic phase measurement errors and signal noise. This is the maximum value of the absolute value of the phase error, as determined by repeatability measurements of the synthetic wavelength phase over the $2\pi$ range.

Referring again to FIG. 1 it can be seen that for a 250 mm distance, a synthetic wavelength of 15 $\mu$m, and a phase measurement uncertainty of 0.5%, it is required that the uncorrelated errors $\delta\lambda/\lambda$ in the wavelength stabilization be less than 0.014 ppm. Employing the 2.5 cm confocal air-spaced etalon for the common etalon 36 a transmission linewidth of 50 MHz, or 0.14 ppm, is readily obtained. Thus, the uncorrelated errors in the feedback locking are required to be less than 10% of the linewidth, which is achieved by the direct DC feedback to the laser diode power supplies 10a and 12a. It should be noted that with common-cavity stabilization any mechanical instabilities, as well as a 0.35 ppm/C thermal expansion of invar mirror mounts in the etalon 36, do not contribute to uncorrelated wavelength errors. As a result, the etalon 36 need not be isolated from the environment. The feedback circuitry provides direct thermal control of the laser diodes 10 and 12 over a range of 0.1 C, with resolution of 100 $\mu$C.

Figure 3:
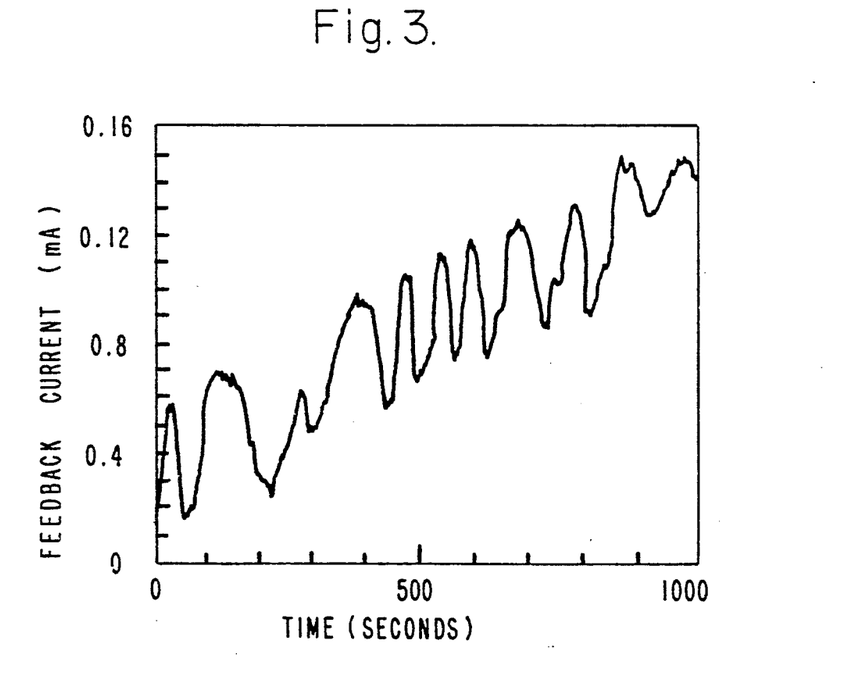
FIG. 3 is a graph showing feedback current, for a single, one of the pair of laser diodes as a function of time, resulting from the use of the etalon of FIG. 2.

The feedback signal as a function of time for one of the laser diodes of FIG. 2, specifically, the 785 nm laser diode D1, is illustrated in FIG. 3. This graph shows oscillations corresponding to a $\pm$ 0.002C resolution of a thermoelectric cooler (not shown in FIG. 2) coupled to the laser diode mount. FIG. 3 illustrates the corrections applied to the laser diode in response to temperature instabilities that would otherwise have altered the diode wavelength. The cooler maintained the laser diode at 16.5C $\pm$ 0.05C for a room temperature of 22.5C $\pm$1.5C. The feedback oscillation has an amplitude corresponding to 0.4 ppm corrections to the laser diode wavelength, while the correction to long term drift is of the order of five ppm. The 0.4 ppm oscillations correspond to the $\pm$0.002C resolution of the thermoelectric cooler which, for the illustrated embodiment, is a Melles Griot 06DTC003 mount and 06DTC001 controller. The 5 ppm long-term correction is attributable to the combined effects of a maximum $\pm$0.05C drift in the thermoelectric cooler and DC power supply drift. It can be seen that the thermoelectric cooler together with the feedback signal from the Fabry Perot etalon 36, controlled for several hours the LD1 10 wavelength over an environmental temperature range of $\pm$1.5C, with an uncertainty of less than 0.014 ppm, as required for two-color interferometry with a 250 mm optical separation.

EXAMPLE

An experiment was performed to test the stability of the wavelengths with respect to one another. The stability was found not to be sensitive to the absolute values of the wavelengths. It was sufficient therefore to use the specified values of $\lambda 1$ and $\lambda 2$ for the laser diodes with corrections on the order of 2 nm to account for differences in operating temperature. The synthetic wavelength was measured directly with respect to these wavelengths by using a motorized micrometer to displace the object mirror 24.

The wavelength stability of the two-color source 2 was tested by measuring the relative optical separation of the object mirror 24 and the reference mirrors over a period of 16 hours. The nominal value of this separation was 250 mm, while the distance from the beam-splitting prism 18 to the reference mirror 20 was one meter. The environmental temperature was monitored by a quartz thermometer (HP 2804 A) and was found to vary over a 0.4C range; resulting is in a 3 $\mu$m variation in the optical separation due to thermal expansion and contraction of the mirror mounts and the optical bench. The optical wavelength measurement was performed by continuous phase tracking a measurement rate of one per minute. The synthetic wavelength measurement was performed every 20 minutes. The comparison in FIG. 4 of the synthetic-wavelength measurement $L_\Lambda$ and the optical-wavelength result $L\lambda$ shows that the common-cavity stabilization assured agreement between the two measurements to within $\pm\lambda/4$, as required by Eq. (10). With the stabilization provided by wavelength control 4 removed there was no correlation at all between the optical and synthetic wavelength results. It is therefore concluded that a two-color interferometer stabilized with the Fabry-Perot cavity 36 may be used over periods of several hours, over a distance of one meter and with an optical separation of up to 250 mm between the reference mirror 20 and the object mirror 24. The temperature-corrected RMS repeatability of the optical measurement was found to be $\lambda/100$ (eight nm) for periods of less than 1000 seconds and $\lambda/20$ (40 nm) over periods of several hours. Thus, by using the synthetic wavelength measurement to remove the optical phase ambiguity there were obtained interferometrically accurate measurements over large optical paths and long time periods, without continuously tracking the optical phase.

Figure 4:
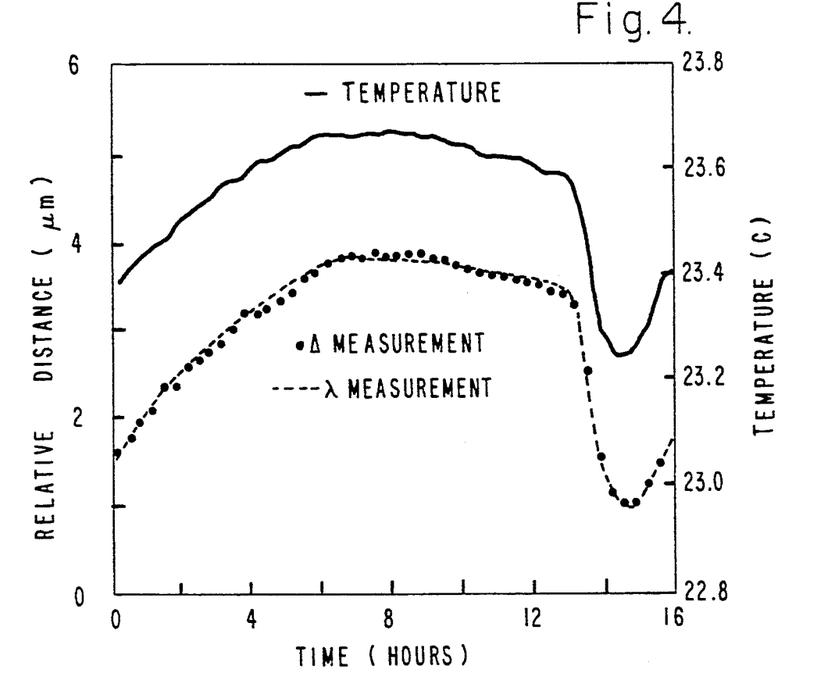
FIG. 4 is a graph showing a comparison of an optical wavelength measurement and a synthetic wavelength result over a period of 16 hours when employing common-cavity wavelength stabilization.

The data represented in FIG. 4 indicates that the synthetic wavelength information may be used to remove the phase ambiguities that occur in optical interferometry for discrete displacements greater than $\lambda/4$ but less than $\Lambda/4$. Further in accordance with the invention a systematic approach to performing such measurements is now described.

The analysis of the two-wavelength data assumes that phase tracking for the synthetic wavelength is valid and that the difference between the synthetic wavelength distance measurement $L_\Lambda$ and the optical wavelength measurement $L\lambda$ differs by less than $\lambda/4$. The absolute value of M is not known because of the ambiguity in the synthetic wavelength measurement. As a result, the determination is restricted to that of the relative fringe numbers M', $m_1'$, and $m_2'$ representing displacement from some initial point of reference. In calculating the displacement of the object mirror 24 there is first obtained the relative synthetic wavelength fringe number M″ from the measured fractional fringe f(M) and the following synthetic-phase tracking equation:

$$M' = f(M) + I(M'(t-1) - f(M)), \quad (29)$$

where M″ (t−1) is the last measured value of M′ and the function I(a) rounds the argument (a) up or down to the nearest integer value. The first value of M is always the first measured fractional fringe f(M′) and it is assumed that M′ does not change by more than 0.5 between two successive measurements. The optical fringe numbers are calculated from:

$$m_1' = f(m_1) + m_1^{(0)} + I\left(M' \frac{\Lambda}{\lambda_1} - f(m_1) - m_1^{(0)}\right) \quad (30)$$

$$m_2' = f(m_2) + m_2^{(0)} + I\left(M' \frac{\Lambda}{\lambda_2} - f(m_2) - m_2^{(0)}\right) \quad (31)$$

where the constant zero-point offsets $m_1^{(0)}$ and $m_2^{(0)}$ are determined by the requirement that $L_\lambda - L_\Lambda$ be null for the first measurement. It is noted that no restriction is placed on the change in the optical fringe order between measurements in that integer changes in $m_1$ and $m_2$ are resolved using the synthetic wavelength. The final step of the measurement determines the relative optical separation L using the formula $$L_\lambda = \frac{1}{2}\left(\frac{\lambda_1 m_1}{2} + \frac{\lambda_2 m_2}{2}\right). \quad (32)$$

Figure 5:
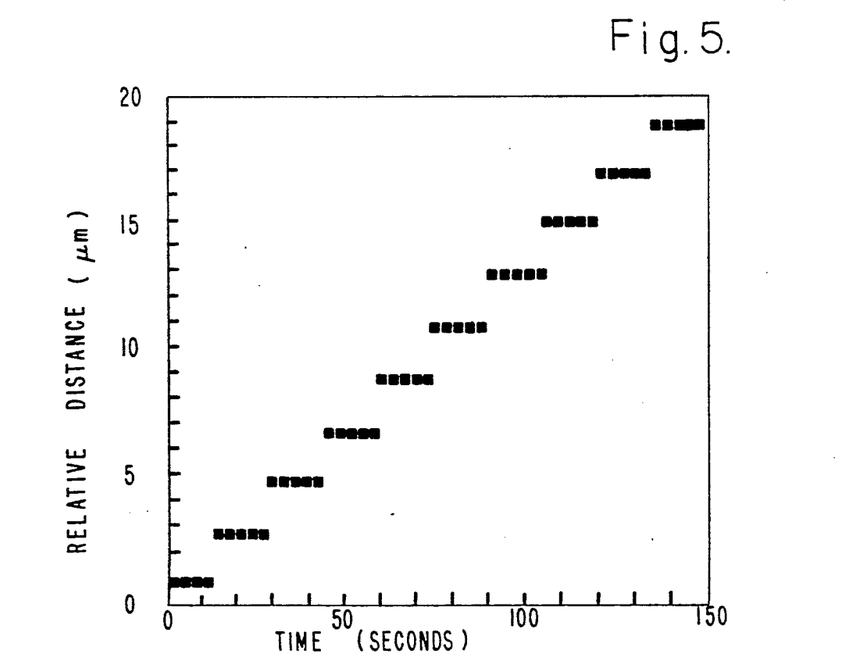
FIG. 5 graphically depicts the results of a two color interferometric measurement of a displacement of the object mirror of FIG. 2.

An example measurement performed in accordance with the foregoing is shown in FIG. 5. The object mirror 24 was displaced in discrete 2 μm steps every 15 seconds using a motorized micrometer, and measurements were made every three seconds using the two-color measurement technique described above. It is noted that the 2 μm steps are an order of magnitude larger than the λ/4 limit of a single-color interferometer.

In summary, it has been shown that two-color interferometry using two laser diodes is made practical for laser gauge applications requiring long-term stability and large optical separations. The single Fabry-Perot etalon stabilization, employing direct feedback of the transmission signal, is adequate for optical separations of 250 mm and synthetic wavelengths of 15 μm. An important requirement is for a small value of uncorrelated errors in the locking procedure. Straightforward improvements to the above include mechanical phase modulation of the etalon 36 cavity together with phase-locked amplification to reduce noise in the feedback signal, and elementary environmental controls for temperature and pressure the etalon 36. Superior control of the laser diode mount temperature is also possible. In this regard Chung and Shay have shown that under carefully controlled conditions a single laser diode can be stabilized with a Fabry Perot interferometer to 7 × 10⁻⁶ ppm (2.5 kHz). (Y. C. Chung and T. M. Shay, "Frequency stabilization of a diode laser to a Fabry-Perot Interferometer" Opt. Eng. 27-424 (1988)). Finally, the phase measurement accuracy may be even further improved by compensating for nonlinearities in the detector circuitry associated with the photodiodes D1′ and D2′.

Thus, although the invention has been described in the context of a specific embodiment thereof it will be appreciated by those having skill in the art that changes and modifications may be made thereto without departing from the scope and spirit of the invention.

What is claimed is:

1. Interferometer apparatus comprising:
    optical source means comprising a first laser diode having a first output wavelength and a second laser diode having a second output wavelength that differs from the first output wavelength;
    means for combining the output from the first laser diode with the output from the second laser diode to provide a source beam;
    means for separating the source beam into a phase modulated reference beam and an object measurement beam; and
    means for comparing a phase of the reference beam to a phase of the object measurement beam for determining a displacement of an object from a reference point; wherein the source means includes wavelength compensation means for simultaneously providing a first wavelength correction signal to the first laser diode and a second wavelength compensation signal to the second laser diode for maintaining the output wavelength of each within a desired range of wavelength, said wavelength compensation means comprising means for sampling the source beam to simultaneously derive the first wavelength correction signal for the first laser diode and the second wavelength correction signal for the second laser diode, the sampling means including a single Fabry Perot etalon disposed for receiving radiation from the source beam and for separately providing radiation having the first wavelength to a first radiation detector and radiation having the second wavelength to a second radiation detector, each of the radiation detectors having an output coupled to one of the laser diodes for providing the wavelength correction signals thereto respectively and means for correlating the outputs of the radiation detectors one to another within the single Fabry Perot etalon to correct for thermally induced wavelength changes within the optical source.

2. Interferometer apparatus as set forth in claim 2 wherein the Fabry Perot etalon is comprised of a confocal air-spaced etalon.

3. Interferometer apparatus as set forth in claim 1 wherein said comparing means includes means for comparing a synthetic wavelength generated from the first wavelength and the second wavelength.

4. An optical source for use with a displacement measurement apparatus, comprising:
    a first laser diode having a first output wavelength and a second laser diode having a second output wavelength that differs from the first output wavelength;
    means for combining onto a common optical path the output of the first laser diode and the output of the second laser diode;
    means for sampling the common optical path to simultaneously derive a wavelength compensation signal for the first laser diode and for the second laser diode, the sampling means including a single Fabry Perot etalon disposed for receiving radiation from the common optical path and for separately providing radiation having the first wavelength to a first radiation detector and radiation having the second wavelength to a second radiation detector, each of the radiation detectors having an output coupled to one of the laser diodes for providing an electrical wavelength correction signal thereto; and means for correlating the outputs of the radiation detectors one to another within the single Fabry Perot etalon to correct for thermally induced optical path length changes within the optical source.

5. An optical source as set forth in claim 4 the Fabry Perot etalon is comprised of a confocal air-spaced etalon.

6. An optical source as set forth in claim 4 and further including spatial filter means disposed relative to the common optical path for combining the output from the first laser diode with the output from the second laser diode to provide a colinear source beam.

7. An optical source as set forth in claim 6 and further including optical isolator means disposed between the spatial filter means and the first laser diode and the second laser diode for preventing optical radiation from feeding back into the laser diodes.

8. An optical source as set forth in claim 4 wherein the output of each of the radiation detectors has an instantaneous magnitude that varies as a function of the instantaneous wavelength output of the associated one of the laser diodes.

9. An optical source as set forth in claim 4 wherein the output of each of the radiation detectors has an instantaneous magnitude that varies as a function of the instantaneous wavelength output of the associated one of the laser diodes, each of the outputs being coupled to the associated laser diode for varying a laser diode pump current so as to maintain the output wavelength at a desired value.

* * * * *